(12) United States Patent
Fujiwara et al.

(10) Patent No.: US 11,075,322 B2
(45) Date of Patent: Jul. 27, 2021

(54) AlINN FILM, TWO-DIMENSIONAL PHOTONIC CRYSTAL RESONATOR, METHOD FOR MANUFACTURING THESE, AND SEMICONDUCTOR LIGHT-EMITTING ELEMENT

(71) Applicant: OSAKA UNIVERSITY, Suita (JP)

(72) Inventors: Yasufumi Fujiwara, Suita (JP); Tomohiro Inaba, Suita (JP)

(73) Assignee: OSAKA UNIVERSITY, Suita (JP)

( * ) Notice: Subject to any disclaimer, the term of this patent is extended or adjusted under 35 U.S.C. 154(b) by 0 days.

(21) Appl. No.: 16/486,556

(22) PCT Filed: Feb. 26, 2018

(86) PCT No.: PCT/JP2018/006965
§ 371 (c)(1),
(2) Date: Aug. 16, 2019

(87) PCT Pub. No.: WO2018/159531
PCT Pub. Date: Sep. 7, 2018

(65) Prior Publication Data
US 2020/0058828 A1  Feb. 20, 2020

(30) Foreign Application Priority Data
Feb. 28, 2017 (JP) .............................. JP2017-036446

(51) Int. Cl.
*H01L 33/32* (2010.01)
*H01L 33/00* (2010.01)
*H01L 33/04* (2010.01)

(52) U.S. Cl.
CPC ............ *H01L 33/32* (2013.01); *H01L 33/007* (2013.01); *H01L 33/04* (2013.01)

(58) Field of Classification Search
CPC ....................................................... H01L 33/04
See application file for complete search history.

(56) References Cited

U.S. PATENT DOCUMENTS

2008/0056320 A1  3/2008 Takeuchi
2012/0138891 A1  6/2012 Chung et al.
(Continued)

FOREIGN PATENT DOCUMENTS

JP   2011-109151 A   6/2011
JP       5300078 B2   9/2013
(Continued)

OTHER PUBLICATIONS

Extended European Search Report for European Application No. 18760348.5, dated Feb. 20, 2020.
(Continued)

*Primary Examiner* — Yu-Hsi D Sun
(74) *Attorney, Agent, or Firm* — Birch, Stewart, Kolasch & Birch, LLP

(57) ABSTRACT

Provided is a technique for manufacturing a semiconductor light-emitting element for which it is possible to dramatically increase light emission efficiency to a greater degree than in the past. An AlInN film provided on a GaN epitaxial film that is formed on a substrate, wherein: the AlInN film is formed by lamination of AlInN layers; between the laminated AlInN layers, there is provided a cap layer that comprises GaN, AlN, or AlGaN, and has a thickness of 0.1-10 nm; a super lattice structure is formed; the total thickness exceeds 200 nm; and the root-mean-square height RMS is 3 nm or less. A method for forming an AlInN film, the method being such that: a step for forming an AlInN layer is repeated a plurality of times, said step involving using any of an organometallic vapor phase growth method, a molecular beam epitaxy method, and a sputtering method to form the AlInN layer to a thickness of 200 nm or less by epitaxial growth in an atmosphere of 700-850° C. on a GaN epitaxial film formed on a substrate; and the AlInN layer is grown until a prescribed thickness is reached.

13 Claims, 6 Drawing Sheets

(56) References Cited

U.S. PATENT DOCUMENTS

2014/0003458 A1 1/2014 Han
2015/0146756 A1* 5/2015 Kawaguchi ............ H01L 33/04
372/45.012

FOREIGN PATENT DOCUMENTS

| JP | 2015-56483 A | 3/2015 |
|----|----|----|
| JP | 2015-160752 A | 9/2015 |
| JP | 5896454 B2 | 3/2016 |
| WO | WO 2014-006813 A1 | 1/2014 |

OTHER PUBLICATIONS

Japanese Notice of Reasons for Refusal for Japanese Application No. 2019-502976, dated Jun. 1, 2020, with an English translation.
Bellanger et al., "Highly Reflective GaN-Based Air-Gap Distributed Bragg Reflectors Fabricated Using AlInN Wet Etching" Appl. Phys. Express, 2009,vol. 2, pp. 121003-1 to 121003-3.
Berger et al., "Growth of AlInN/GaN distributed Bragg reflectors with improved Interface quality", Journal of Crystal Growth, 2015, vol. 414, pp. 105-109.
Carlin et al., "Progresses in Ill-nitride distributed Bragg reflectors and microcavities using AlInN/GaN materials", phys.stat.sol. (b), 2005, vol. 242, No. 11, pp. 2326-2344, DOI 10.1002/pssb.200560968.
Inaba et al., "Controlling of Eu emission properties in Eu-doped GaN by microcavity", Mar. 3, 2016, non-official translation, Lecture proceedings of <63th> JSAP spring meeting, The Japan Society of Applied Physics, p. 11-313.
Inaba et al., "Growth of thick AlInN layer for fabrication of GaN based nanoscale photonic devices", Mar. 1, 2017, non-official translation, Lecture proceedings of <64th> JSAP spring meeting, p. 13-322.
International Search Report, issued in PCT/JP2018/0006965, dated May 22, 2018.
Kozuka et al., "Nitride-based distributed Bragg reflectors with AlInN grown at high growth rate", 2014, Lecture proceedings of the 61st Annual Spring Meeting of the Institute of Applied Physics, p. 15-135.
Simeonov et al., "High quality nitride based microdisks obtained via selective wet etching of AlInN sacrificial layers", Applied Physics Letters, 2008, vol. 92, pp. 171102-1 to 171102-3.
Taiwanese Office Action, issued in Application No. 107106585, dated Nov. 28, 2018.
Written Opinion of the International Searching Authority, issued in PCT/JP2018/0006965, dated May 22, 2018.
Office Action dated Nov. 2, 2020, in Republic of Korea Patent Application No. 10-2019-7026044.

* cited by examiner

[Fig. 1]
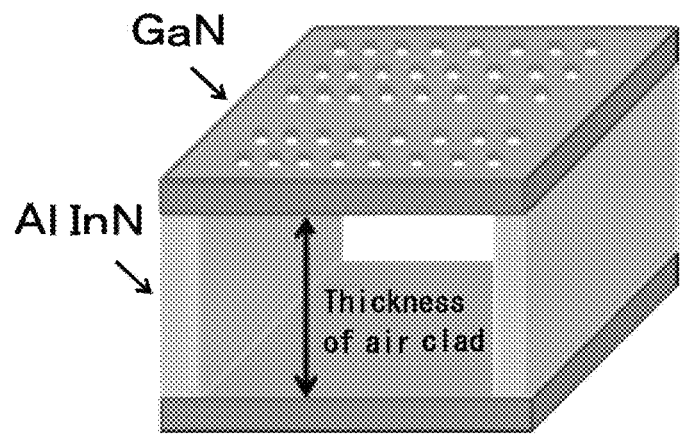
[Fig. 2]
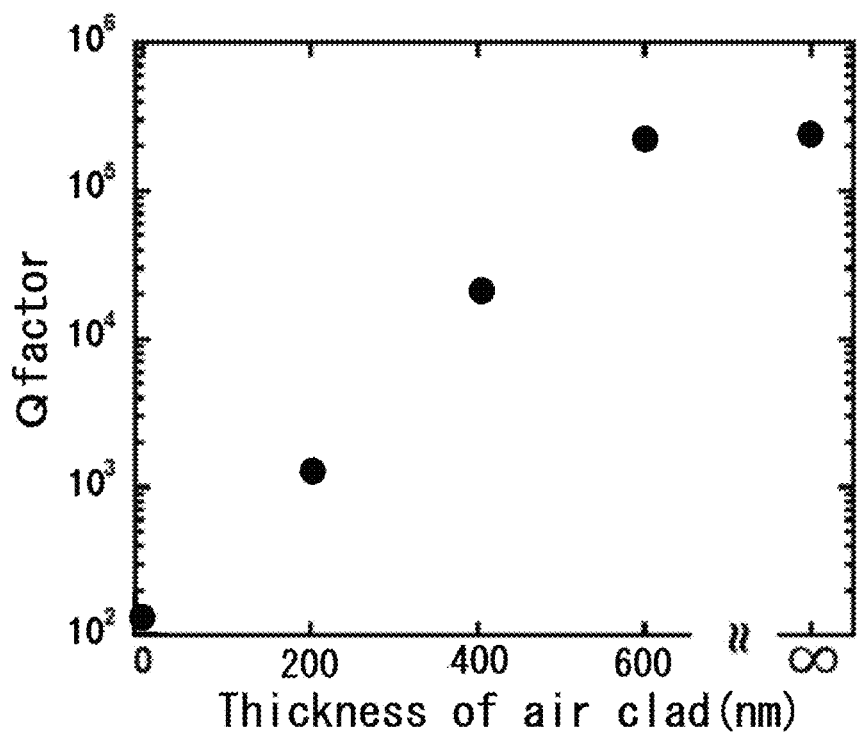

[Fig. 3]
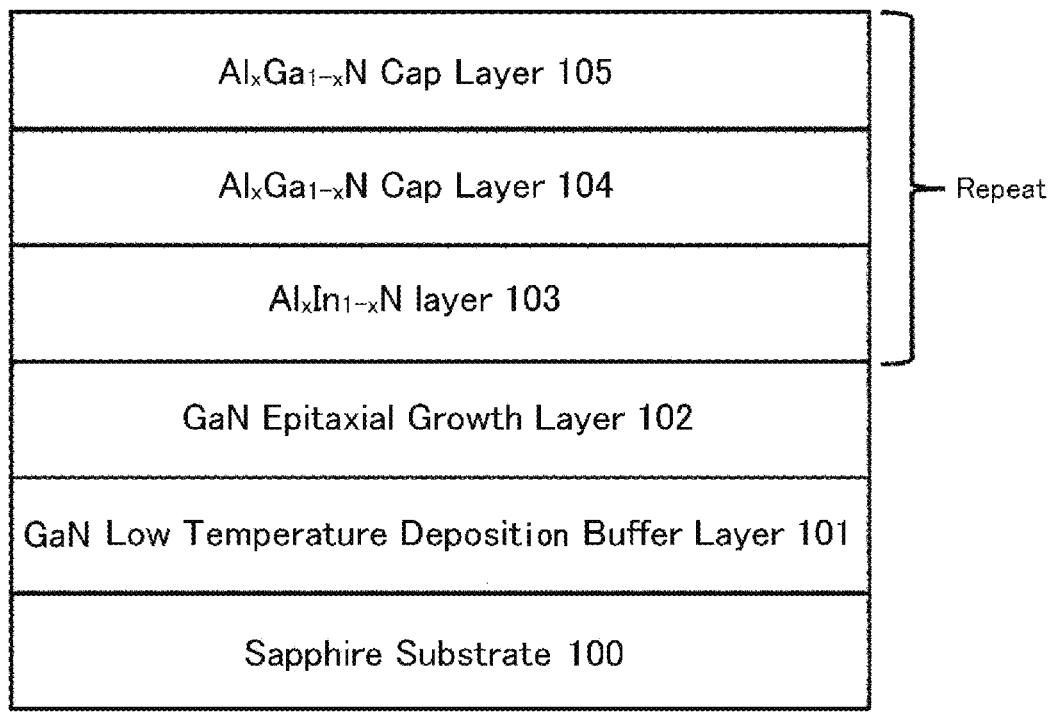

[Fig. 4]
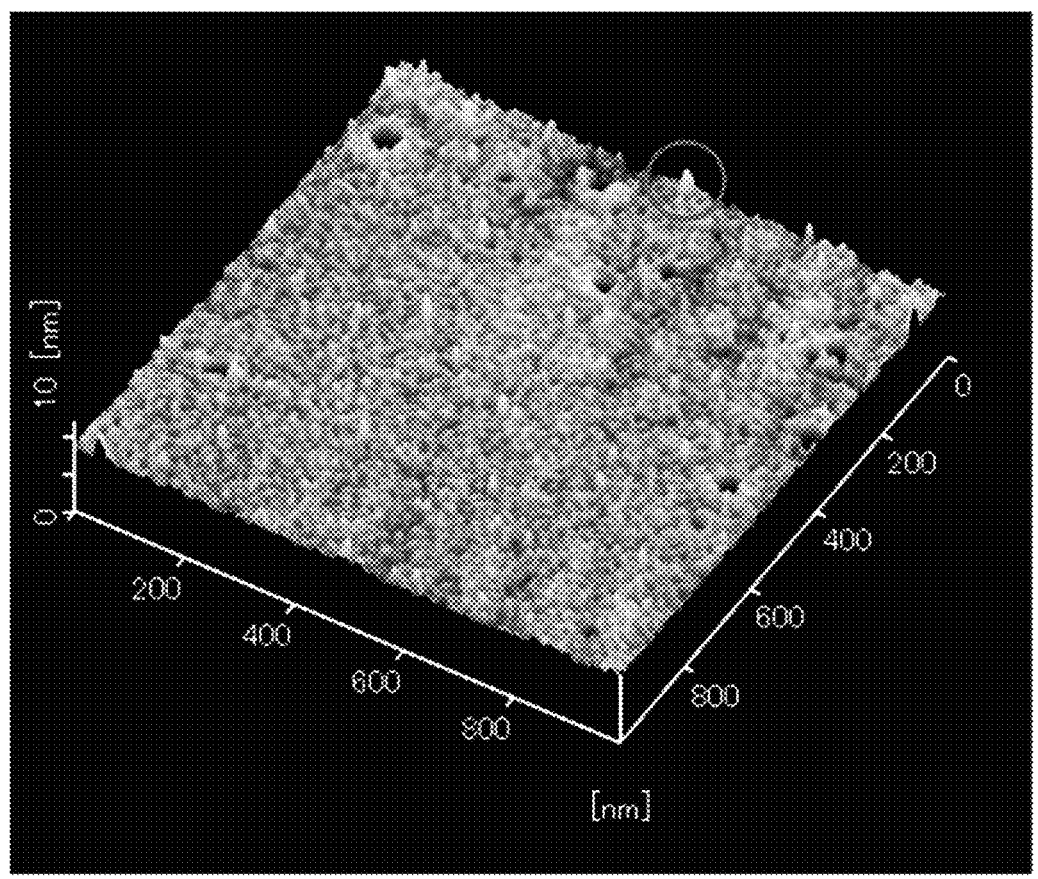
[Fig. 5]
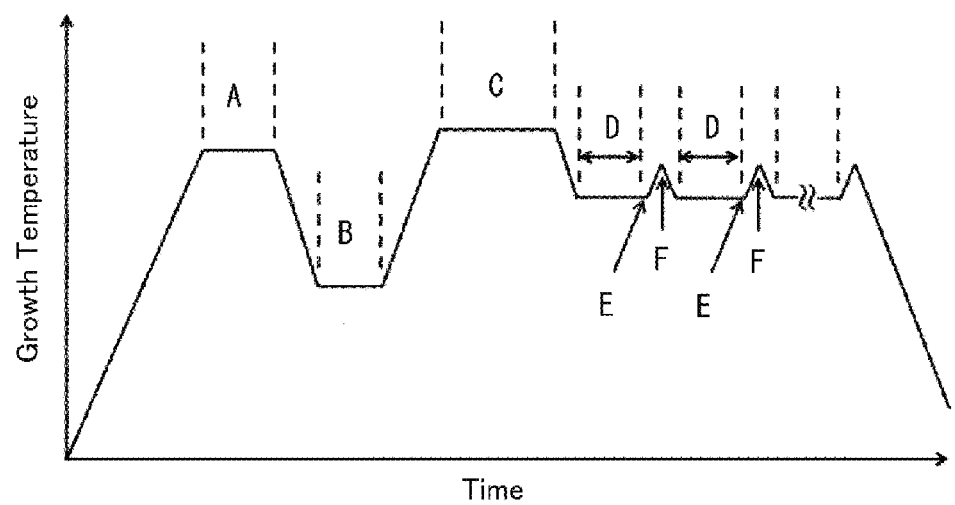

[Fig. 6]
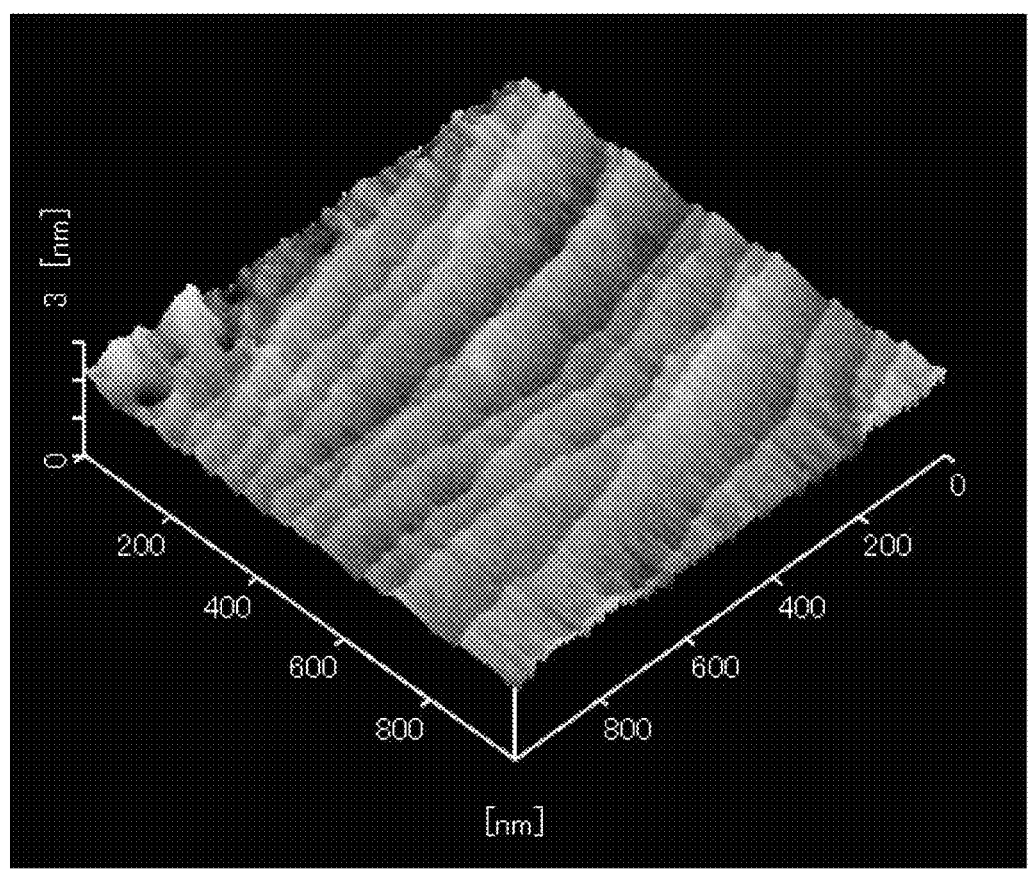

[Fig. 7]
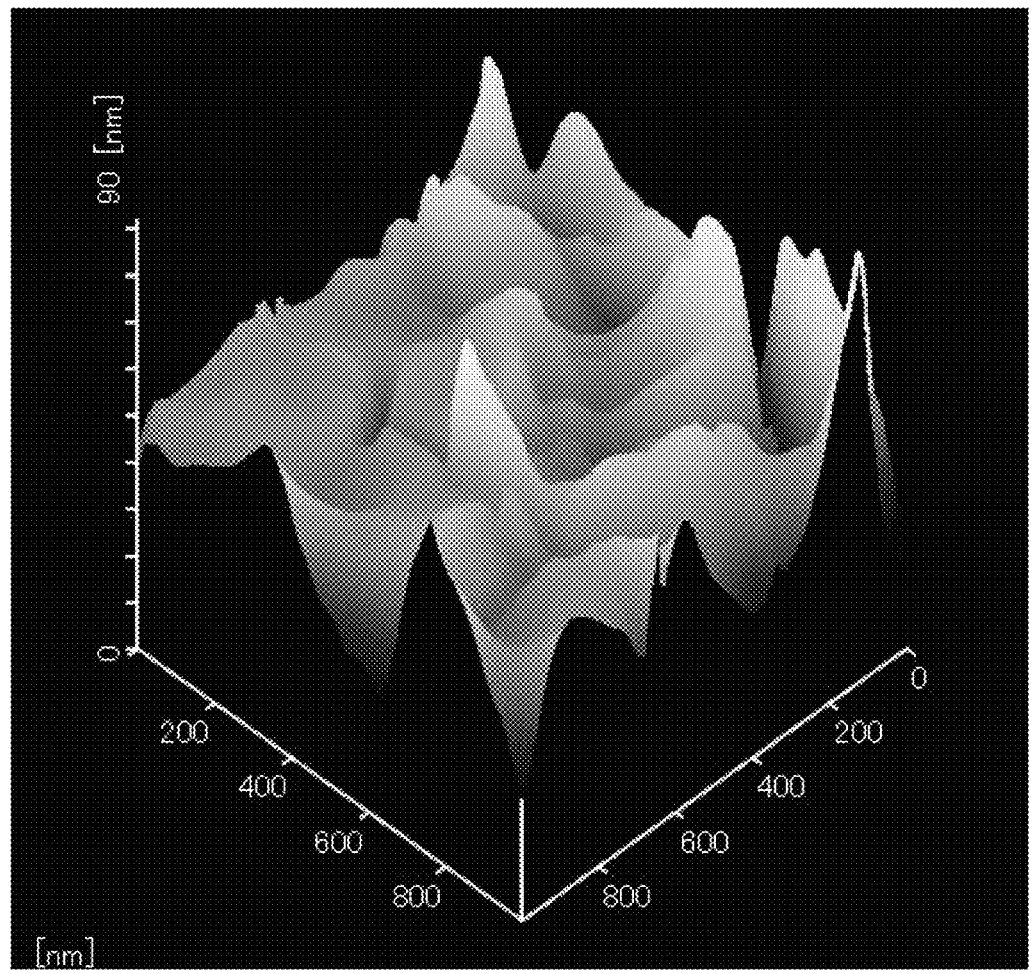
[Fig. 8]
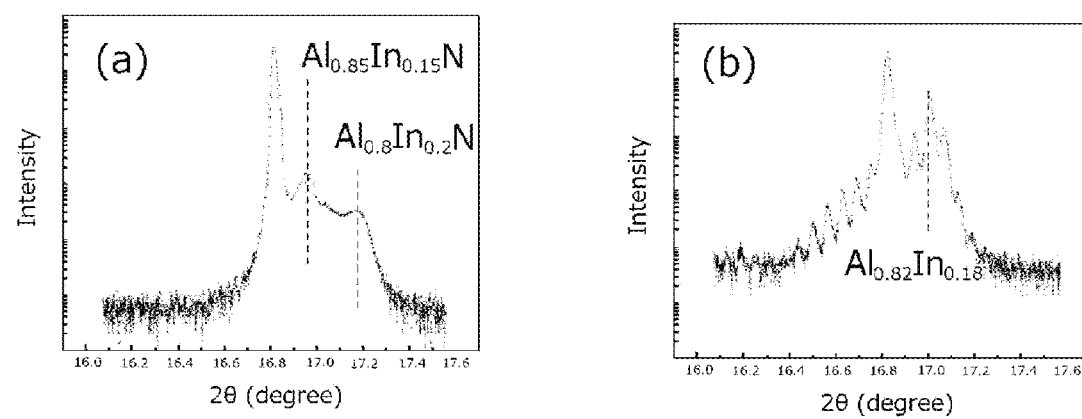

[Fig. 9]
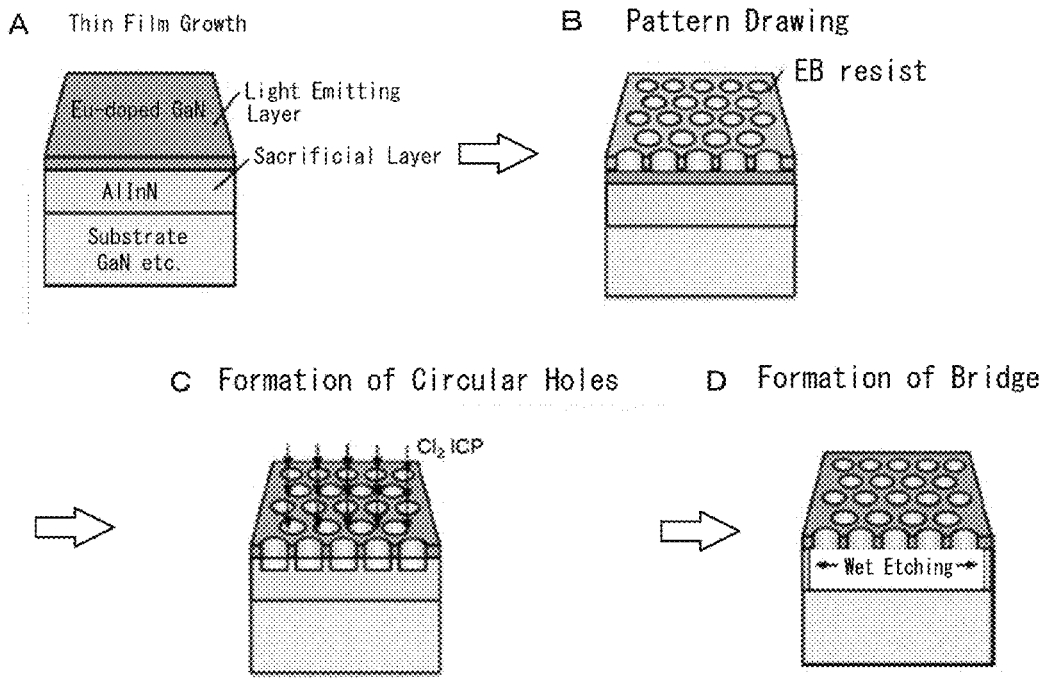
[Fig. 10]
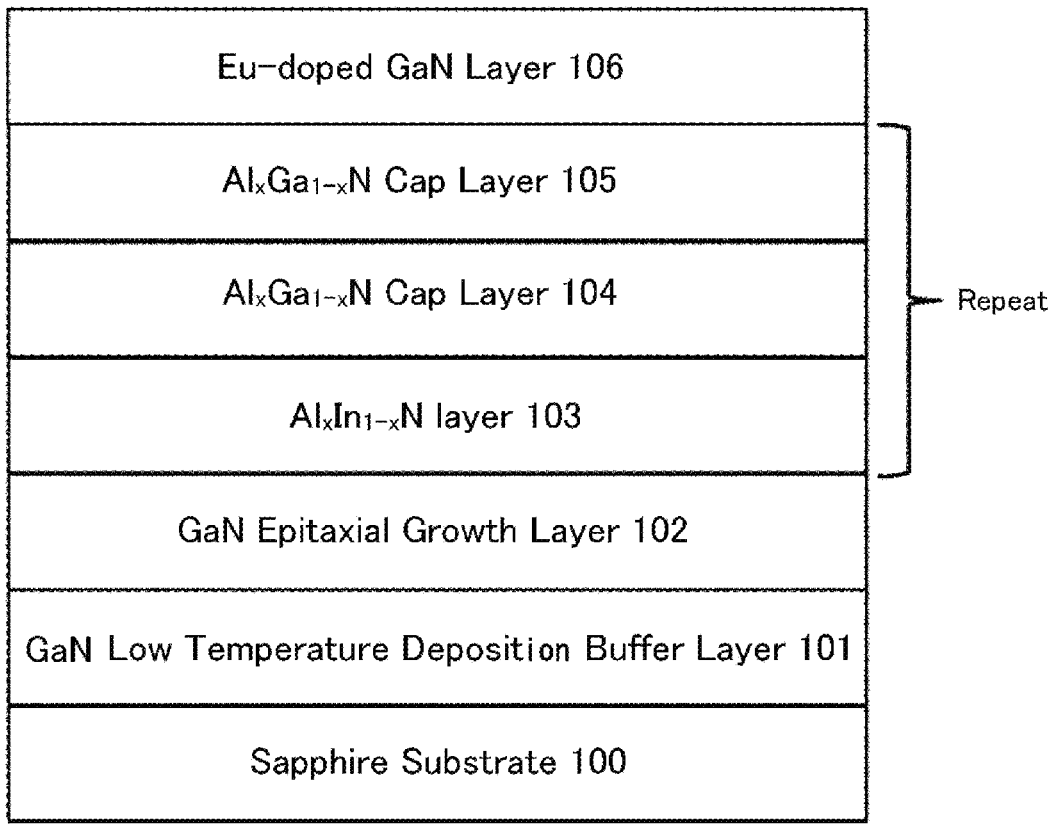

AlInN FILM, TWO-DIMENSIONAL PHOTONIC CRYSTAL RESONATOR, METHOD FOR MANUFACTURING THESE, AND SEMICONDUCTOR LIGHT-EMITTING ELEMENT

TECHNICAL FIELD

The present invention relates to an $Al_xIn_{1-x}N$ (hereinafter, referred to as "AlInN") film and a two-dimensional photonic crystal resonator, a method for manufacturing them, and a semiconductor light-emitting element. In more detail, the present invention relates to a thick AlInN film, a two-dimensional photonic crystal resonator and method for manufacturing the same wherein an air clad layer is formed by using the AlInN film as a sacrificial layer (a layer finally removed), and a semiconductor light-emitting element equipped with the two-dimensional photonic resonator.

A nitride semiconductor such as gallium nitride (GaN) has attracted attention as a semiconductor material constituting a blue light-emitting device, and in recent years, it is expected to realize a green light-emitting device and further a red light-emitting device by adding indium (In) to GaN at high concentration. However, as the In composition increases, the crystallinity is degraded, and the luminous efficiency decreases due to the piezoelectric field effect. Therefore, it is difficult to realize a red light-emitting device by controlling the In composition.

Under these circumstances, the present inventors have succeeded in obtaining a red light-emitting diode with an optical output exceeding 100 μW ahead of the world by manufacturing a light-emitting diode (LEDs) using Eu-doped GaN (GaN:Eu) by organometal vapor phase epitaxial (OMVPE) and increasing the light emission transition probability (Patent Document 1).

As such a red light-emitting diode is realized, it becomes possible to integrate three primary light-emitting diodes using a nitride semiconductor on a same substrate together with a blue light-emitting diode and a green light-emitting diode which have already been developed. Since this will be possible, applications are expected in fields such as small-sized, high-resolution full-color displays, and LED illumination to which light emission of red region not included in current white LEDs is added.

On the other hand, in recent years, semiconductor light-emitting devices such as light-emitting diodes and laser diodes (LDs) have been widely used. For example, LEDs are used for various display devices, backlights of liquid crystal display devices for mobile phones and the like, white lights, etc., while LDs are used as light sources for Blu-ray Disc for record playback of high-definition video, optical communication, CD, DVD, etc.

Recently, applications of high-frequency devices such as MMICs (monolithic microwave integrated circuits) for mobile phones and HEMTs (high electron mobility transistors) and applications of high-power devices such as inverter power transistors for automotive related applications and Schottky-barrier diodes (SBDs) are expanding.

However, in order to use the GaN-based light-emitting element described above for these devices, further increase in luminous efficiency is required, and various improvements have been proposed.

For example, in Patent Document 2, the luminous efficiency is increased by forming a two-dimensional photonic crystal structure. Further, in Patent Documents 3 and 4, an AlInN layer is grown on a GaN layer to form a reflecting mirror structure to increase the luminous efficiency.

It is known that this AlInN layer lattice-matches with GaN by setting the In composition to about 0.18 (for example, non-patent documents 1 and 2). As the result, crystal defects such as dislocations are not easily mixed during film formation, and a highly crystalline heterojunction structure can be obtained. Since such an AlInN layer can be wet etched with nitrilotriacetic acid or the like, a two-dimensional photonic crystal structure can be easily formed using AlInN as a sacrificial layer (for example, Non-Patent Documents 3 and 4).

PRIOR ART DOCUMENT

Patent Document

PATENT DOCUMENT 1: JP5896454B
PATENT DOCUMENT 2: JP5300078B
PATENT DOCUMENT 3: JP-A-2015-056483
PATENT DOCUMENT 4: JP-A-2015-160752

Non-Patent Document

NON-PATENT DOCUMENT 1: Yuugo Kozuka et al., "Nitride-based distributed Bragg reflectors with AlInN grown at high growth rate", Lecture proceedings of the 61st Annual Spring Meeting of the Institute of Applied Physics (2014) 15-135.
NON-PATENT DOCUMENT 2: J.-F. Carlin et al., "Progresses in III-nitride distributed Bragg reflectors and microcavities using AlInN/GaN materials", phys.stat.sol. (b) 242, No. 11, 2326-2344 (2005)/DOI 10.1002/pssb.200560968.
NON-PATENT DOCUMENT 3: D Simeonov et al., "High quality nitride based microdisks obtained via selective wet etching of AlInN sacrificial layers", APPLIED PHYSICS LETTERS 92, 171102 (2008).
NON-PATENT DOCUMENT 4: M. Bellanger et al., "Highly Reflective GaN-Based Air-Gap Distributed Bragg Reflectors Fabricated Using AlInN Wet Etching" Appl. Phys. Express 2, 12003 (2009).

SUMMARY OF THE INVENTION

Problems to be Solved by the Invention

However, in the above-described conventional techniques, it cannot be said that the luminous efficiency can be sufficiently increased, and further improvement is desired.

Then, an object of the present invention is to provide the manufacturing technique of a semiconductor light-emitting element capable of achieving an increase in luminous efficiency dramatically as compared with the prior art.

Means of Solving the Problems

As a result of intensive studies, the present inventor has found that the above-mentioned problems can be solved by the inventions described below, and has completed the present invention.

The invention according to embodiment 1 is
an AlInN film provided on a GaN epitaxial film formed on a substrate, which is formed by stacking AlInN layers, wherein
a cap layer having a thickness of 0.1 to 10 nm and made of GaN, AlN or AlGaN is provided between the stacked AlInN layers to form a super-lattice structure,
the total thickness exceeds 200 nm and
the root mean square height RMS is 3 nm or less.

The invention according to embodiment 2 is the AlInN film according to embodiment 1, wherein a thickness of each of the AlInN layers in the super+lattice structure is 200 nm or less.

The invention according to embodiment 3 is the AlInN film according to embodiment 1 or embodiment 2, wherein the number of In droplets on the surface of the AlInN layer is $5 \times 10^6$ pieces/cm$^2$ or less.

The invention according to embodiment 4 is the AlInN film according to embodiment 3, wherein no In droplets exist on the surface of the AlInN layer.

The invention according to embodiment 5 is the AlInN film according to any one of embodiments 1 to 4, wherein the AlInN is $Al_xIn_{1-x}N$ (x=0.75 to 0.90).

The invention according to embodiment 6 is a method for manufacturing an AlInN film, comprising:

growing an AlInN layer to a predetermined thickness by repeating an AlInN layer forming step a plurality of times where the AlInN layer having the thickness of 200 nm or less is formed by epitaxial growth under an atmosphere of 700 to 850° C. by using any of organometal vapor phase growth method, molecular beam epitaxy method, and sputtering method, on the GaN epitaxial film formed on a substrate.

The invention according to embodiment 7 is the method for manufacturing an AlInN film according to embodiment 6, further comprising, an AlInN layer formation interruption step for interrupting the growth of the AlInN layer by maintaining the ambient temperature at a temperature lower than the growth temperature of AlInN for a predetermined time, between the preceding AlInN layer formation step and the subsequent AlInN layer formation step when repeating the AlInN layer formation step a plurality of times.

The invention according to embodiment 8 is the method for manufacturing an AlInN film according to embodiment 6, further comprising, a cap layer forming step of forming a cap layer having the thickness of 0.1 to 10 nm and made of GaN, AlN or AlGaN on the AlInN layer formed in the preceding AlInN layer forming step under the same atmosphere temperature as the AlInN layer forming step, and a temperature rising/falling step of raising temperature of the AlInN layer on which the cap layer is formed and falling the temperature to the same atmosphere temperature as the AlInN layer forming step, between the preceding AlInN layer formation step and the subsequent AlInN layer formation step when repeating the AlInN layer formation step a plurality of times.

The invention according to embodiment 9 is the method for manufacturing an AlInN film according to embodiment 8, wherein a second cap layer is formed on the cap layer formed in the cap layer forming step when the temperature is raised to a predetermined temperature in the temperature raising/falling step.

The invention according to embodiment 10 is a method for manufacturing a two-dimensional photonic crystal resonator, which manufactures a two-dimensional photonic crystal resonator by using the AlInN film according to any one of embodiments 1 to 5 as a sacrificial layer, comprising: forming the AlInN film and the light-emitting layer on a substrate where a GaN epitaxial film is formed, and then forming an air clad layer by wet-etching the AlInN film.

The invention according to embodiment 11 is a two-dimensional photonic crystal resonator configured by stacking an air cladding layer formed by wet etching an AlInN film and a light-emitting layer on a substrate on which a GaN epitaxial film is formed, wherein the air cladding layer is formed to a thickness of more than 200 nm.

The invention according to embodiment 12 is the two-dimensional photonic crystal resonator according to embodiment 11, wherein the air cladding layer is formed to have a thickness corresponding to one wavelength of light emitted from the light-emitting layer.

The invention according to embodiment 13 is the two-dimensional photonic crystal resonator according to embodiment 11 or embodiment 12, wherein the substrate on which the GaN epitaxial film is formed is configured by stacking the GaN epitaxial film on any one of a sapphire substrate, a GaN substrate, and a Si substrate.

The invention according to embodiment 14 is a semiconductor light-emitting element wherein an n-type GaN layer, a GaN-based light-emitting layer and a p-type GaN layer are provided in order from the substrate side, and the two-dimensional photonic crystal resonator according to anyone of embodiments 11 to 13 is provided between the n-type GaN layer and the GaN-based light-emitting layer.

EFFECT OF THE INVENTION

According to the present invention, it is possible to provide a manufacturing technique for a semiconductor light-emitting element capable of achieving an increase in light luminous efficiency dramatically as compared with the prior art.

BRIEF DESCRIPTION OF THE DRAWINGS

FIG. 1 A perspective view schematically showing a structure of a two-dimensional photonic crystal resonator according to an embodiment of the present invention.

FIG. 2 A figure showing the relationship between the thickness of an air clad layer and Q value in a two-dimensional photonic crystal resonator.

FIG. 3 A figure for explaining the structure of the AlInN film according to an embodiment of the present invention.

FIG. 4 A surface AFM image of the AlInN film in the middle of film formation.

FIG. 5 A figure for explaining the growth sequence in one embodiment of the present invention.

FIG. 6 A surface AFM image of the AlInN film according to an embodiment of the present invention.

FIG. 7 A surface AFM image of an AlInN film produced by continuous growth.

FIG. 8 An X-ray diffraction curve of an AlInN film.

FIG. 9 A figure for explaining the preparation process of the two-dimensional photonic crystal according to an embodiment of the present invention.

FIG. 10 A figure for explaining the structure of the two-dimensional photonic crystal according to an embodiment of the present invention.

EMBODIMENT FOR CARRYING OUT THE INVENTION

[1] Process of Study in the Present Invention

First, the process of study in the present invention will be described, and then specific embodiments will be described. In the following, a red light-emitting semiconductor using Eu-doped GaN (GaN:Eu) is described as an example, but the same can be considered for a GaN based blue light-emitting semiconductor and a GaN based green light-emitting semiconductor.

1. Regarding Enhancement of Luminous efficiency

As described above, the present invention is intended to increase luminous efficiency (light emission intensity), and as a measure therefor, it is conceivable to improve the emission transition probability and the light extraction efficiency.

(1) Emission Transition Probability

As described above, regarding the improvement of the emission transition probability, the present inventors have improved the emission transition efficiency in a red light-emitting semiconductor using Eu-doped GaN (GaN:Eu), and has obtained light output exceeding to 100 μW.

The light emission transition efficiency can be represented by the reciprocal of the light emission lifetime. Therefore, the light emission transition efficiency can be further improved by shortening the light emission lifetime. At present, however, the light emission lifetime in GaN is as long as about 280 μs and it cannot be said that the light emission transition efficiency of GaN is enough.

(2) Light Extraction Efficiency

On the other hand, regarding improvement of light extraction efficiency, since only light at the critical angle or smaller can be extracted into air, the light extraction amount from GaN at 622 nm, which is the emission wavelength of the red light-emitting semiconductor described above, is as low as about 4% at present. Therefore, further improvement of the light extraction efficiency is desired.

2. Investigation of Measures for Increasing Luminous Efficiency

Therefore, the present inventors thought that the light extraction amount can be increased and the light extraction efficiency can be improved if the light can be emitted in the direction perpendicular to the GaN light-emitting layer by controlling the light emission direction. As a result, the present inventors have come up with a resonator using a resonator distributed Bragg reflector (resonator DBR) applied by a laser diode or the like.

That is, in the case of using a microresonator whose resonance direction is perpendicular to the GaN light-emitting layer, the coupling constant to mode in the perpendicular direction increases while the coupling constant to propagation mode decreases, so that even light at the critical angle or smaller can be taken out into the air with high efficiency. In addition, when such a microresonator is used, the density of states of light is modulated in the resonator to shorten the light emission lifetime, so that the emission transition probability of the resonance wavelength can be increased. As a result of these, the emission intensity can be increased by the microresonator, and the luminous efficiency can be improved.

Generally, a two-dimensional photonic crystal is used to form the above-described resonator DBR. In a two-dimensional photonic crystal, a region having a refractive index different from that of a base material is provided two-dimensionally periodically in a base material made of a dielectric to form an air clad layer. Since a photonic band gap in which light cannot propagate is formed in the crystal, light emitted from the light-emitting layer cannot propagate in the plane of the periodic structure and is confined in the air clad layer, and it will be propagated only in perpendicular direction.

As an index for evaluating such a two-dimensional photonic crystal resonator, there is a resonator Q value (hereinafter, also simply referred to as "Q value"), and the larger the Q value, the larger the light confinement, and the light emission characteristics improve, so that the luminous efficiency improves.

The present inventors examined how much thickness is necessary to obtain a two-dimensional photonic crystal of high Q value, using finite-difference time-domain method (FDTD). Specifically, in the two-dimensional photonic crystal resonator having the structure shown in FIG. 1, the Q value was calculated by changing the thickness of the air clad layer. In FIG. 1, the upper GaN is an active layer to be a light-emitting layer, and AlInN on both sides is a bridge portion of the air clad layer.

The results are shown in FIG. 2. In FIG. 2, "∞" indicates the case where there is no substrate.

According to FIG. 2, in the two-dimensional photonic crystal resonator having such a structure, it was found that a high Q value could be obtained when an air clad layer having a thickness of at least 600 nm corresponding to about one wavelength at the emission wavelength of the Eu-doped GaN layer is formed. It turned out that the fact that a high Q value can be obtained when the thickness of air clad layer exceeds the thickness corresponding to about one wavelength at this emission wavelength, which is the same for the blue GaN layer and the green GaN layer described above as well as the red emission of the Eu-doped GaN layer.

This result shows that, in the two-dimensional photonic crystal resonator, a high Q value can be obtained if the air clad layer is formed to have a thickness corresponding to about one wavelength at the emission wavelength of each color (for example, a thickness of about 200 nm in the case of violet light having a short wavelength). However, changing the thickness of the air clad layer for each luminescent color is not efficient in terms of production. Therefore, it is preferable to form the air clad layer with one kind of thickness exceeding the thickness corresponding to about one wavelength at the emission wavelength of the longest wavelength, specifically, it is preferable to form the air clad layer of a thickness exceeding 600 nm according to the red emission with the longest wavelength. By forming such an air clad layer, a high Q value can be obtained even for light emission of a wavelength below that, which is efficient in manufacturing.

3. Study on Formation of Air Clad Layer

As a technique for forming an air clad layer in a two-dimensional photonic crystal structure, conventionally, a technique has been proposed where an AlInN layer is formed as a sacrificial layer on a GaN layer and then wet etching is performed.

However, in the conventional AlInN layer formation technology, when the thickness of the AlInN layer exceeds 100 nm, In droplets are deposited on the surface of the AlInN layer, and deterioration of the surface state cannot be avoided, and the limit is about 200 nm. (S Zhang et al., "Growth mechanism of vertical compositional inhomogeneities in AlInN films", J. Phys. D: Appl. Phys. 44 (2011) 075405 (4 pp)). That is, in the prior art, it was not possible to form the AlInN layer with a thickness of 600 nm corresponding to about one wavelength at the emission wavelength as described above.

Under these circumstances, the present inventors noticed that, during the formation of the AlInN layer, the deposition of In droplets was few and the surface state was hardly deteriorated until the growth to a thickness of about 200 nm. It is considered that, by stacking such an AlInN layer, an AlInN layer having a good surface state can be formed even with a thickness of 600 nm, and various experiments and studies have been conducted to complete the present invention.

[2] Embodiments

Hereinafter, the present invention will be specifically described based on the embodiments. The present invention is not limited to the following embodiments. Various modifications can be made to the following embodiments within the same and equivalent scope of the present invention.

1. AlInN Film

First, the AlInN film according to the present embodiment will be described. The AlInN film according to the present embodiment is an AlInN film provided on a GaN epitaxial film formed on a substrate, and is characterized in that it is formed by stacking an AlInN layer,
a cap layer made of GaN, AlN or AlGaN and having a thickness of 0.1 to 10 nm is provided between the stacked AlInN layers to form a super-lattice structure,
the total thickness exceeds 200 nm, and
the root mean square height RMS is 3 nm or less.

An AlInN film having an excellent surface state in which the root mean square height RMS (Root Mean Square) is 3 nm or less can be suitably used as a sacrificial layer for forming a two-dimensional photonic crystal resonator. For example, a light-emitting GaN layer is formed on the AlInN film and then selective wet etching is conducted using nitrilotriacetic acid as an etching solution, thereby, the AlInN film can be easily dissolved and removed to form an air clad layer.

At this time, if the thickness of the AlInN film is equal to or more than the thickness corresponding to one wavelength of the light emitted from the light-emitting layer, a two-dimensional photonic crystal structure having an air clad layer in which the thickness corresponding to at least one light emission wavelength is secured can be formed, so that a resonator with higher Q value can be provided, as described above.

The AlInN film according to the present embodiment is preferably formed, for example, by stacking an AlInN layer with little deposition of In droplets, specifically an AlInN layer having a thickness of 200 nm or less, preferably 100 nm or less, more preferably, an AlInN layer with no In droplets. Since the surface state is not deteriorated in the AlInN layer in which deposition of In droplets is few, the surface state does not deteriorate even when the thickness is more than 200 nm by stacking. Here, "less deposits of In droplets" means that the number of In droplets on the surface of the AlInN film is $5 \times 10^6$ pieces/cm$^2$ or less.

Further, in the AlInN film according to the present embodiment, a cap layer of 0.1 to 10 nm thick made of GaN, AlN or AlGaN is provided between the stacked AlInN layers to form a super-lattice structure. By providing the cap layer between the AlInN layers, it is possible to prevent the desorption of In from the AlInN layer and to further suppress the formation of In droplets on the surface of the AlInN layer, so that an AlInN film of excellent surface state can be provided. And it is further preferable that this cap layer is provided also in the outermost layer.

The AlInN formed as a film in the present embodiment is preferably $Al_xIn_{1-x}N$ (x=0.75 to 0.90), more preferably $Al_xIn_{1-x}N$ (x=0.75 to 0.85), further preferably $Al_xIn_{1-x}N$ (x=0.82).

When the AlInN film is $Al_xIn_{1-x}N$ (x=0.75 to 0.90), the degree of lattice mismatch with GaN as the substrate decreases, and therefore, it is possible to grow an AlInN film without causing distortion or the like. Further, $Al_xIn_{1-x}N$ (x=0.82) is further preferable because the degree of lattice mismatch with GaN is approximately 0%.

In addition, as a substrate on which an AlInN film is grown, it is possible to use a substrate in which a GaN film is formed on an inexpensive sapphire substrate instead of the expensive GaN bulk substrate as in the conventional case, so that manufacturing cost can be reduced. In the present embodiment, a GaN substrate, a Si substrate or the like may be used as a growth substrate.

2. Manufacturing of AlInN Film

The AlInN film according to the present embodiment described above can be manufactured by repeating a plurality of times of AlInN layer forming step of epitaxially growing the AlInN layer to a thickness of 200 nm or less, preferably 100 nm or less, using organometal vapor phase growth method under an atmosphere of 700 to 850° C., preferably 780 to 850° C., to grow the AlInN layer to a predetermined thickness on the GaN epitaxial film formed on the substrate.

As described above, when the AlInN layer is grown to a thickness of about 200 nm in an atmosphere of 700 to 850° C., the deposition of In droplets is few and the surface state is hardly deteriorated. Therefore, the AlInN layer having a favorable surface state can be formed by repeating the forming step a plurality of times and stacking the layers to a predetermined thickness.

As a specific manufacturing method, for example, two manufacturing methods described below can be adopted, but these are merely examples of the embodiment. Other methods may be adopted as long as the method that an AlInN layer with almost no deterioration of the surface state is stacked.

(1) Combination of AlInN Layer Forming Step and AlInN Layer Forming Interrupting Step The first manufacturing method is a method in which an AlInN layer formation interruption step of interrupting the growth of the AlInN layer for a predetermined time while maintaining the ambient temperature at 700 to 850° C. is provided between the preceding AlInN layer forming step and the subsequent AlInN layer forming step, when the AlInN layer forming step is repeated a plurality of times.

When the AlInN layer is epitaxially grown to a thickness of 200 nm or less in an atmosphere of 700 to 850° C. by using organometal vapor phase growth method, deposition of In droplets is few and the surface state is hardly deteriorated. However, if the temperature is maintained as it is, formation of the AlInN layer proceeds to cause further deposition of In droplets, resulting in deterioration of the surface state.

Therefore, after forming the AlInN layer to a predetermined thickness of 200 nm or less, the atmospheric temperature is maintained at a temperature lower than the growth temperature of AlInN, and the growth of the AlInN layer is interrupted for a predetermined time. As a result, the AlInN layer in a state in which the In droplets hardly deposit is fixed. Thereafter, even if the AlInN layer formation step is resumed, an AlInN layer in a state in which the In droplets hardly deposit is formed and can be stacked. As a result, even if an AlInN layer is formed to a thickness of more than 200 nm to a thickness of 600 nm, it is possible to form an AlInN layer having a favorable surface state.

The thickness of the AlInN layer formed in each of one AlInN layer forming step is not particularly limited as long as In droplets hardly deposit. However, when the thickness is thin, the number of stacks increases, and the AlInN layer formation step and the AlInN layer formation interruption step have to be switched frequently, which may lead to a decrease in productivity. Therefore, the thickness of the AlInN layer formed in one AlInN layer forming step is preferably 75 to 100 nm, and in view of suppressing deposition of In droplets more surely, about 75 nm is particularly preferable. In this case, an AlInN layer having a thickness of about 600 nm can be formed by film formation eight times.

In the above, the AlInN layer is formed by using an organometal vapor phase growth method, but a molecular beam epitaxy, a sputtering or the like may be used.

(2) Combination of AlInN Layer Forming Step, and Cap Layer Forming Step and Temperature Rising/Falling Step The second manufacturing method is a method in which, a cap layer forming step of forming a cap layer made of GaN, AlN or AlGaN, having a thickness of 0.1 to 10 nm, preferably 1 to 10 nm, on the AlInN layer formed in the preceding AlInN layer forming step, under the same temperature atmosphere as the AlInN layer forming step; and a temperature rising/falling step of raising the temperature of the AlInN layer on which the cap layer is formed and then lowering the temperature to the same temperature atmosphere as the AlInN layer forming step are provided between the preceding AlInN layer forming step and the subsequent AlInN layer forming step, when repeating the AlInN layer forming step a plurality of times.

As described above, by repeating the AlInN layer formation step and the AlInN layer formation interruption step to stack the AlInN layers, the AlInN layer having a good surface state can be formed. However, the AlInN layer formation interruption step requires long time and the productivity cannot be sufficiently improved. In addition, there is a risk that In may be released from the AlInN layer while interrupting the formation of the AlInN layer.

Therefore, in the present method, the cap layer forming step as described above is provided in place of such an AlInN layer formation interrupting step. By providing such a cap layer, it is possible to suppress the deposition of In droplets on the surface of the AlInN layer, and to prevent the desorption of In from the AlInN layer.

Then, after the cap layer is formed, a temperature rising/falling step is provided where the temperature of the AlInN layer on which the cap layer is formed is further raised (900° C. or more, preferably about 1000° C.), and then lower the temperature to the same temperature atmosphere (700 to 850° C.) as the AlInN layer forming step. At this time, by raising the temperature temporarily, In droplets can be evaporated and removed, and the AlInN layer and the cap layer can be smoothed.

As a result, when the AlInN layer forming step is resumed, the AlInN layer is formed on the smoothed AlInN layer and the cap layer, and AlInN having a better surface state can be obtained even if it is a thick film.

In addition, although formation of this cap layer may be formation of only one layer, a two-step formation is more preferable in which a second cap layer is formed on the cap layer formed in the cap layer formation process (the first cap layer) when it is heated up to predetermined temperature in a temperature rising/falling process. Specifically, the formation of the first cap layer is performed in the same temperature atmosphere (about 800° C.) as the formation of the AlInN layer, and then the temperature is raised to a temperature higher by about 200° C. (to about 1000° C.), followed by performing the second cap layer formation in the temperature atmosphere. At this time, since the In droplets evaporate as the temperature rises, it is possible to form a second cap layer with better surface smoothness. As described above, after providing the second cap layer with good surface smoothness, the temperature is lowered to the formation temperature of the AlInN layer to resume the AlInN layer formation step, whereby it is possible to obtain an AlInN film with a better surface state.

In the production of the AlInN film described above, for example, trimethylaluminum (TMAl), trimethylindium (TMIn), and ammonia ($NH_3$) can be used as the raw materials for Al, In and N. In addition, trimethylgallium (TMGa), for example, is used as a Ga source for generating GaN forming the substrate, and hydrogen ($H_2$), for example, is used as a carrier gas when forming an AlInN film.

3. Two-Dimensional Photonic Crystal Resonator

Next, a two-dimensional photonic crystal resonator will be described. Two-dimensional photonic crystal resonators are generally characterized by being ultra-compact and high in optical confinement rate. The two-dimensional photonic crystal resonator of the present embodiment is equipped with an air clad layer, and the thickness of the air clad layer is more than 200 nm, and preferably a thickness equal to or greater than the length corresponding to one wavelength of light to be generated. In this way, the Q value is further improved.

In the present embodiment, the thickness of the air clad layer in the two-dimensional photonic resonator shown in FIG. 1 exceeds 200 nm. For example, in the case where the light-emitting layer is an active layer generating red light, it has a thickness of at least 600 nm which corresponds to one wavelength.

Such an air clad layer is manufactured by the following method. First, an AlInN layer of a predetermined thickness is formed as a sacrificial layer on the substrate (produced by forming a GaN layer on a sapphire substrate) using the method described above, and then a light-emitting layer (GaN:Eu layer) is formed on the AlInN layer. Here, the light-emitting layer (GaN:Eu layer) is formed by adding $1 \times 10^{17}$ to $5 \times 10^{21}$ $cm^{-3}$ of Eu, more preferably, $1 \times 10^{19}$ to $5 \times 10^{20}$ $cm^{-3}$ of Eu, based on the method already proposed by the present inventor in Patent Document 1 and the like. Note that instead of Eu, Pr may be added to form a GaN:Pr layer.

Next, a nano-sized pattern is formed on the top surface of the light-emitting layer using a method such as electron beam drawing or nanoimprinting.

Next, nano-sized circular holes are formed in accordance with the pattern using an inductively coupled plasma etching apparatus, a reactive ion etching apparatus, or the like.

Thereafter, by pouring a mixed solution of potassium hydroxide and nitrilotriacetic acid into the formed circular holes for electrolysis or by wet etching using hot nitric acid, the sacrificial layer is removed to form the air clad layer.

4. Semiconductor Light-emitting Element

The semiconductor light-emitting element manufactured using the two-dimensional photonic crystal resonator described above secures a sufficiently high Q value because an air clad layer is formed to a thickness corresponding to one light emission wavelength. Thus, the emission intensity can be increased, and the luminous efficiency can be dramatically increased as compared with the prior art.

5. Different Uses of Two-Dimensional Photonic Crystal Resonators

In the above, two-dimensional photonic crystal resonators are used for a semiconductor light-emitting element, but when a light absorbing layer is provided instead of the light-emitting layer, the light absorption efficiency can be greatly improved because the absorbed light is confined in the two-dimensional photonic crystal resonator and cannot escape to the outside. Therefore, when such a two-dimensional photonic crystal resonator is used for a solar cell, the conversion efficiency of light into electricity can be greatly increased to provide a high efficiency solar cell.

EXAMPLE

Hereinafter, the present invention will be described in detail using examples.

1. Production of AlInN Film

First, production of an AlInN film will be described with reference to FIG. 3. FIG. 3 is a view for explaining the structure of the AlInN film in the present embodiment.

(1) Preparation of Substrate

First, the sapphire substrate 100 is placed in a reaction furnace of an organometal vapor phase growth apparatus. Thereafter, the temperature in the reaction furnace is raised in an atmosphere in which ammonia and hydrogen flow into the reaction furnace, and the surface of the sapphire substrate 100 is thermally cleaned.

Next, TMGa (trimethylgallium) and ammonia, which are source gases, are supplied together with hydrogen, which is a carrier gas, into the reaction furnace, and, by setting the temperature atmosphere lower (about 500° C.) than the normal growth temperature of GaN (about 1000° C.), the GaN low temperature deposition buffer layer 101 is crystal-grown to a thickness of about 30 nm on the surface of the sapphire substrate 100.

By providing such a GaN low temperature deposition buffer layer 101, the lattice constant difference between the sapphire substrate 100 and the GaN epitaxial growth layer 102 formed on the GaN low temperature deposition buffer layer 101 can be relaxed. Hence, this is preferable.

Next, the temperature atmosphere (substrate temperature) in the reaction furnace is raised to a high temperature of, for example, about 1000° C. Thereby, a high quality GaN epitaxial growth layer 102 oriented in the +c axis is grown on the GaN low temperature deposition buffer layer 101 without causing lattice mismatch with the sapphire substrate 100. Then, it is grown to a predetermined thickness, for example, about 2000 nm. Thus, the preparation of the substrate before the formation of the AlInN film is completed.

(2) Formation of AlInN Film

Next, the temperature atmosphere (substrate temperature) in the reaction furnace is lowered to about 800° C., and then nitrogen as a carrier gas, ammonia as a nitrogen source, and Group III material sources which are TMA (trimethylaluminum) and TMIn (trimethylindium) are supplied into the reaction furnace.

As a result, the $Al_xIn_{1-x}N$ layer 103 (x=0.75 to 0.90) grows on the GaN epitaxial growth layer 102. Then, it is grown to a predetermined thickness, for example, about 75 nm.

FIG. 4 shows the surface AFM image (surface image by atomic force microscope) of the AlInN film taken out of the reactor at this point when the growth of the $Al_xIn_{1-x}N$ layer 103 was interrupted.

It can be seen from FIG. 4 that projections of the In droplet are formed at a plurality of places such as a circled part. Such In droplets are formed more as the film thickness increases, so deterioration of the surface state is caused when the AlInN film becomes thick, although deposition of In droplets is less and the surface state is not so deteriorated at a film thickness of about 75 nm. It is considered that such deterioration of the surface state causes the deterioration of the surface smoothness because the concentration of the substantial In element staying on the growth surface is increased by the supply of the excess In element.

(3) Formation of Cap Layer

Therefore, in the present embodiment, the film formation of the $Al_xIn_{1-x}N$ layer 103 is temporarily interrupted at the film thickness where the deposition of In droplets is still few and the surface state of the AlInN film is not deteriorated, specifically, a film thickness of up to about 100 nm.

Then, TMAl, TMGa and ammonia are supplied under an atmosphere at the formation temperature of the AlInN film, thereby several nm of $Al_xGa_{1-x}N$ cap layer 104 (x=0.0 to 1.0) (first cap layer) is deposited on the surface of the $Al_xIn_{1-x}N$ layer 103. Thereafter, the growth temperature is raised to about 1000° C. Along with this temperature rise, as described above, In droplets evaporate and are removed. Then, several nm of $Al_xGa_{1-x}N$ cap layer 105 (x=0.0 to 1.0) (second cap layer) is deposited again at the temperature after the temperature rise. After the formation of the second cap layer is completed, the temperature is lowered to the growth temperature of the $Al_xIn_{1-x}N$ layer to resume the formation of the $Al_xIn_{1-x}N$ layer 103.

(4) Repeated Formation of AlInN Film and Formation of Cap Layer

Hereinafter, formation of AlInN film and formation of cap layer are repeated until the total thickness becomes a desired thickness. During the formation of the cap layer, In droplets are removed, so that the surface state is not deteriorated. even if the AlInN film and the cap layer are stacked to form a thick film.

The above steps are shown as a growth sequence in FIG. 5. The respective sequences shown in A to F in FIG. 5 are as follows:

A: thermal cleaning of sapphire substrate
B: formation of GaN low temperature deposition buffer layer
C: formation of GaN epitaxial growth layer
D: formation of $Al_xIn_{1-x}N$ layer
E: formation of $Al_xGa_{1-x}N$ cap layer (first cap layer) at the same growth temperature as $Al_xIn_{1-x}N$ layer
F: formation of $Al_xGa_{1-x}N$ cap layer (second cap layer) grown at a temperature after temperature increase In the sequence F for forming the second cap layer, since the In droplets can be evaporated and removed in the process of temperature increase,
the $Al_xGa_{1-x}N$ cap layer 105 with high surface smoothness can be formed as the second cap layer.

Note that the AlInN layer can be formed with few In droplets even if the following method is adopted instead of the formation of the cap layer described above. That is, the ambient temperature is maintained at a temperature lower than the growth temperature of AlInN, so that the growth of the AlInN layer is interrupted for a predetermined time. As a result, the AlInN layer in a state in which the In droplets are few is fixed, so that the AlInN layer can be formed and stacked in a state in which the In droplets are few even if the AlInN layer forming step is resumed thereafter.

(5) Evaluation of AlInN Film

(a) Surface State

Surface AFM images (area of 1×1 μm) of the AlInN film manufactured according to the growth sequence of FIG. 5 (example) and the AlInN film manufactured by continuous growth (comparative example) were obtained, and the root mean square (RMS) values of their surface roughness were evaluated. FIG. 6 shows a surface AFM image of the AlInN film of the example, and FIG. 7 shows a surface AFM image of the AlInN film of the comparative example.

Comparing FIGS. 6 and 7, it is seen that the surface smoothness is significantly improved in the example as compared to the comparative example. And while RMS in Example is 0.17 nm, RMS in a comparative example is much larger, 7.15 nm, showing a surface state with large unevenness.

Then, as shown in FIG. 6, in the example, the In droplet is not found, and a flat surface is formed so that the atomic layer step can be confirmed. From this result, it is confirmed that, when film formation is performed according to the above-described growth sequence, it becomes possible to form an AlInN film with a significantly improved surface smoothness. It is considered that the reason why the In droplets are not found in this way is that when the temperature is raised in the sequence F of FIG. 5, the In droplets deposited on the surface at the time of AlInN growth are evaporated, removed and etched.

(b) Evaluation of Crystallinity by X-ray Diffraction Measurement

Next, X-ray diffraction measurement was performed on the AlInN films of the example and the comparative example. The obtained X-ray diffraction curve is shown in FIG. In FIG. 8, (a) is a comparative example and (b) is an example, and the horizontal axis is the rotation angle (2θ), and the vertical axis is the X-ray diffraction intensity.

From FIG. 8, in both the comparative example (a) and the example (b), strong peaks (peaks around 16.8° of each curve) attributed to (0002) diffraction of the underlying GaN epitaxial growth layer 102 are observed. The AlInN crystal layer is observed on the high angle side, but the appearance is different.

That is, in Comparative Example (a), peaks of $Al_{0.85}In_{0.15}N$ and $Al_{0.8}In_{0.2}N$ and, between them, a broad peak are confirmed. This suggests that the In composition of the $Al_xIn_{1-x}N$ layer 103 has a distribution.

On the other hand, in the example (b), although the fringes caused by the $Al_xIn_{1-x}N$ layer 103 and the $Al_xGa_{1-x}N$ cap layers 104 and 105 are confirmed, the peak of AlInN of In composition other than $Al_{0.82}In_{0.18}N$ and a broad peak have not been confirmed. From this result, it can be confirmed that the uniformity of the In composition is improved when the film formation is performed in accordance with the above-described growth sequence.

2. Manufacture of Two-Dimensional Photonic Crystal

Next, manufacture of a two-dimensional photonic crystal using the AlInN film manufactured above will be described. FIG. 9 is a view for explaining the manufacturing process of this two-dimensional photonic crystal.

(1) Thin Film Growth (Formation of Light-Emitting Layer)

First, as shown in FIG. 9A, the Eu-doped GaN layer 106 as a light-emitting layer is formed on the AlInN film formed above.

Specifically, as shown in FIG. 10, based on the method already proposed by the present inventor in Patent Document 1 etc., Eu-doped GaN layer 106 (300 nm thick) is formed on the AlInN film (thickness 600 nm) produced in the structure shown in FIG. 3. The Eu-doped GaN layer 106 corresponds to the "GaN" layer shown in FIG. 1.

(2) Formation of Air Clad Layer

Next, an air clad layer is formed according to the procedure of B to D in FIG. 9 using the AlInN film as a sacrificial layer.

(A) Pattern Drawing

In the present embodiment, a nano-sized pattern is produced on the Eu-doped GaN layer using electron beam drawing (EB resist), but a method of nanoimprint can be used instead.

Specifically, first, a resist for electron beam is applied to the surface of the formed Eu-doped GaN layer. Next, the whole is heated and dried on a hot plate. Thereafter, a fine structure is drawn on the surface of the Eu-doped GaN layer using an electron beam exposure machine, and development is performed. Thereby, a nano-sized pattern of resist is formed on the surface of the Eu-doped GaN layer.

(B) Formation of Circular Holes

Next, as shown in FIG. 9C, nano-sized circular holes are formed from the Eu-doped GaN layer to the AlInN film using an inductively coupled plasma etching apparatus or a reactive ion etching apparatus.

(C) Formation of Bridge

Next, as shown in D of FIG. 9, the AlInN film which is a sacrificial layer is removed by wet etching to form a bridge that holds the air clad layer.

Specifically, after removing the resist on the surface of the Eu-doped GaN layer, by performing electrolysis using a mixed solution of potassium hydroxide and nitrilotriacetic acid, or by using thermal nitric acid, the AlInN film is removed by wet etching except leaving the side portions as a bridge. At this time, the cap layer formed between the AlInN layers is peeled off by its own weight and removed according to the removal of the AlInN film together with the AlInN film, since the cap layer is thin and low in strength.

As a result, an air clad layer is formed between the substrate and the Eu-doped GaN layer, the manufacture of the two-dimensional photonic crystal is completed, and the two-dimensional photonic crystal resonator as shown in FIG. 1 is manufactured.

3. Semiconductor Element

Next, a semiconductor element provided with the above two-dimensional photonic crystal resonator (example) is manufactured, and the emission intensity is measured together with a conventional semiconductor element without the two-dimensional photonic crystal resonator (comparative example). The increase in the luminous efficiency was confirmed by comparing them.

As a result, it was found that the light emission intensity of the example is 10 times larger than that of the comparative example, and it can be confirmed that the luminous efficiency is dramatically increased. It is considered that, as described above, the luminous efficiency is dramatically increased because the light emission transition probability is increased and the light extraction efficiency is also increased by providing the two-dimensional photonic crystal resonator according to the present embodiment.

DESCRIPTION OF THE REFERENCE NUMERALS 100 sapphire substrate
101 GaN low temperature deposition buffer layer
102 GaN epitaxial growth layer
103 $Al_xIn_{1-x}N$ layer
104, 105 $Al_xGa_{1-x}N$ cap layer
106 Eu-doped GaN layer

What is claimed is:

1. An AlInN film provided on a GaN epitaxial film formed on a substrate, which is formed by stacking AlInN layers, wherein
a cap layer having a thickness of 0.1 to 10 nm and made of GaN, AlN or AlGaN is provided between the stacked AlInN layers to form a super-lattice structure,
the total thickness exceeds 200 nm, and
the root mean square height (RMS) is 3 nm or less.

2. The AlInN film according to claim 1, wherein a thickness of each of the AlInN layers in the super-lattice structure is 200 nm or less.

3. The AlInN film according to claim 2, wherein the number of In droplets on the surface of the AlInN layer is $5 \times 10^6$ pieces/cm$^2$ or less.

4. The AlInN film according to claim 2, wherein the AlInN is AlxIn1–xN (x=0.75 to 0.90).

5. A method for manufacturing a two-dimensional photonic crystal resonator, which manufactures a two-dimensional photonic crystal resonator by using the AlInN film according to claim 2 as a sacrificial layer, comprising: forming the AlInN film and the light-emitting layer on a substrate where a GaN epitaxial film is formed, and then forming an air clad layer by wet-etching the AlInN film.

6. The AlInN film according to claim 1, wherein the number of In droplets on the surface of the AlInN layer is $5 \times 10^6$ pieces/cm$^2$ or less.

7. The AlInN film according to claim 6, wherein no In droplets exists on the surface of the AlInN layer.

8. The AlInN film according to claim 7, wherein the AlInN is AlxIn1–xN (x=0.75 to 0.90).

9. The AlInN film according to claim 6, wherein the AlInN is AlxIn1–xN (x=0.75 to 0.90).

10. A method for manufacturing a two-dimensional photonic crystal resonator, which manufactures a two-dimensional photonic crystal resonator by using the AlInN film according to claim 6 as a sacrificial layer, comprising: forming the AlInN film and the light-emitting layer on a substrate where a GaN epitaxial film is formed, and then forming an air clad layer by wet-etching the AlInN film.

11. The AlInN film according to claim 1, wherein the AlInN is AlxIn1–xN (x=0.75 to 0.90).

12. A method for manufacturing a two-dimensional photonic crystal resonator, which manufactures a two-dimensional photonic crystal resonator by using the AlInN film according to claim 1 as a sacrificial layer, comprising: forming the AlInN film and the light-emitting layer on a substrate where a GaN epitaxial film is formed, and then forming an air clad layer by wet-etching the AlInN film.

13. The AlInN film according to claim 1, wherein a thickness of the AlInN layer formed in one AlInN layer forming step is 75 to 100 nm.

* * * * *